US010658251B2

(12) United States Patent
Watanabe

(10) Patent No.: US 10,658,251 B2
(45) Date of Patent: May 19, 2020

(54) PROCESS OF FORMING SEMICONDUCTOR SUBSTRATE BY USE OF NORMALIZED REFLECTIVITY

(71) Applicant: SUMITOMO ELECTRIC DEVICE INNOVATIONS, INC., Yokohama-shi, Kanagawa (JP)

(72) Inventor: Tadashi Watanabe, Yokohama (JP)

(73) Assignee: SUMITOMO ELECTRIC DEVICE INNOVATIONS, Kanagawa (JP)

( * ) Notice: Subject to any disclaimer, the term of this patent is extended or adjusted under 35 U.S.C. 154(b) by 0 days.

(21) Appl. No.: 15/982,125

(22) Filed: May 17, 2018

(65) Prior Publication Data

US 2018/0350700 A1 Dec. 6, 2018

(51) Int. Cl.
*H01L 21/66* (2006.01)
*H01L 21/02* (2006.01)
*H01L 29/66* (2006.01)
*H01L 29/778* (2006.01)
*C30B 29/40* (2006.01)

(Continued)

(52) U.S. Cl.
CPC .......... *H01L 22/26* (2013.01); *C23C 16/0272* (2013.01); *C23C 16/303* (2013.01); *C23C 16/52* (2013.01); *C30B 25/183* (2013.01); *C30B 29/403* (2013.01); *C30B 29/406* (2013.01); *H01L 21/0254* (2013.01); *H01L 21/0262* (2013.01); *H01L 21/02378* (2013.01); *H01L 21/02458* (2013.01); *H01L 22/12* (2013.01); *H01L 29/66462* (2013.01); *H01L 29/7786* (2013.01); *H01L 29/2003* (2013.01)

(58) Field of Classification Search
CPC ......... H01L 21/02378; H01L 21/02458; H01L 21/0262; H01L 22/26; H01L 22/12; H01L 29/7786; H01L 29/66462; H01L 29/2003; C30B 29/406; C30B 29/403; C30B 25/183; C23C 16/52; C23C 16/303; C23C 16/0272

See application file for complete search history.

(56) References Cited

U.S. PATENT DOCUMENTS 5,979,423 A * 11/1999 Poindexter .......... F02D 41/1451
123/697
6,410,347 B1 * 6/2002 Baek ....................... C30B 25/16
257/E33.069

(Continued)

FOREIGN PATENT DOCUMENTS

| JP | 2009-194002 | 8/2009 |
| JP | 2013-012767 | 1/2013 |
| JP | 2013-251330 | 12/2013 |

*Primary Examiner* — Laura M Menz
*Assistant Examiner* — Candice Chan
(74) *Attorney, Agent, or Firm* — Smith, Gambrell & Russell, LLP.

(57) ABSTRACT

A process of forming an epitaxial substrate is disclosed, where the epitaxial substrate includes a nucleus forming layer made of aluminum nitride (AlN) grown on a substrate made of silicon carbide (SiC). The process includes steps of: (1) first measuring the first reflectivity $R_0$ of a surface of the SiC substrate, (2) growing the nucleus forming layer made of AlN as measuring second reflectivity $R_1$ of a grown surface of the AlN nucleus forming layer, and (3) ending the growth of the AlN nucleus forming layer when a ratio $R_1/R_0$ of the reflectivity enters a preset range.

9 Claims, 8 Drawing Sheets

(51) Int. Cl.
*C23C 16/52* (2006.01)
*C30B 25/18* (2006.01)
*C23C 16/02* (2006.01)
*C23C 16/30* (2006.01)
*H01L 29/20* (2006.01)

(56) References Cited

U.S. PATENT DOCUMENTS

| | | | | |
|---|---|---|---|---|
| 6,563,578 B2 * | 5/2003 | Halliyal | ............... | C23C 14/547 |
| | | | | 257/E21.528 |
| 2011/0033966 A1 * | 2/2011 | Su | ..................... | C23C 16/303 |
| | | | | 438/47 |
| 2013/0321082 A1 | 12/2013 | Yamada | | |

* cited by examiner

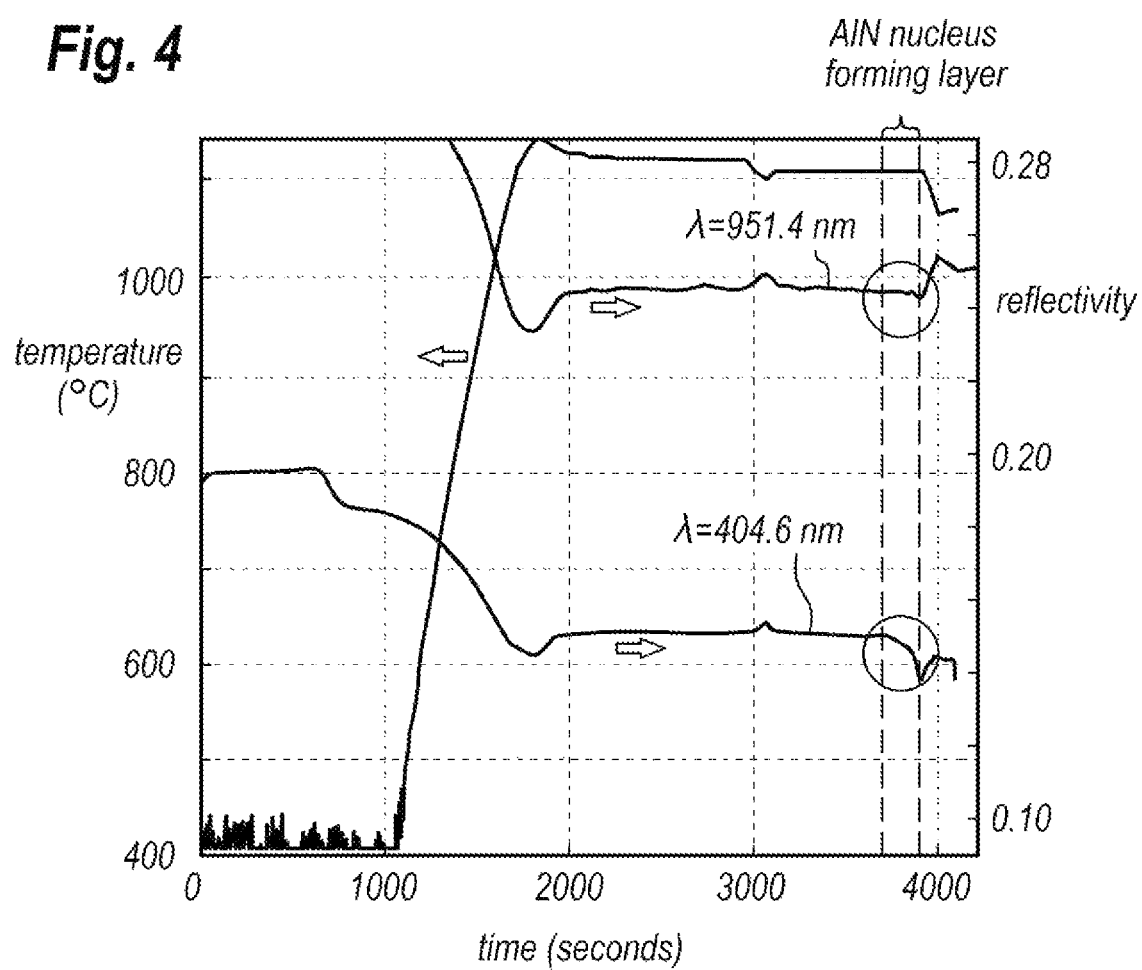

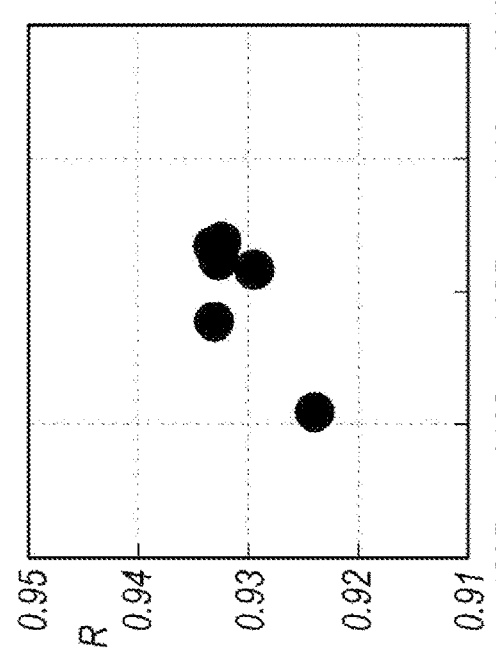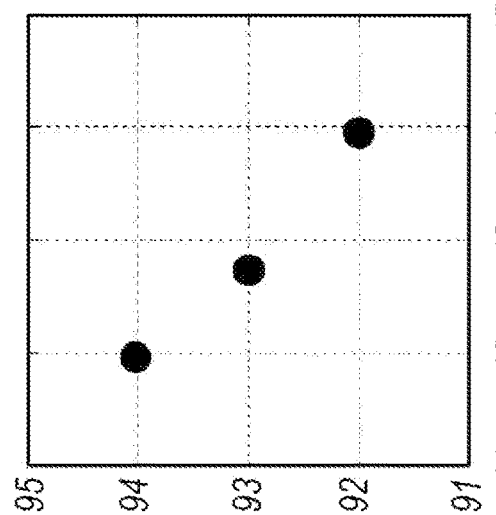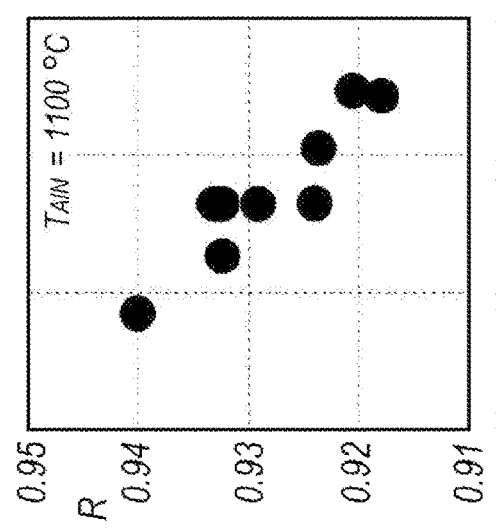

PROCESS OF FORMING SEMICONDUCTOR SUBSTRATE BY USE OF NORMALIZED REFLECTIVITY

CROSS REFERENCE TO RELATED APPLICATION

The present application is based on and claims the benefit of priority of Japanese Patent Application No. 2017-110361, filed on Jun. 2, 2017, the entire content of which is incorporated herein by reference.

TECHNICAL FIELD

1. Field of the Invention

The present invention relates to a process of forming an epitaxial substrate, in particular, the process of forming an epitaxial substrate including an aluminum nitride (AlN) layer on a silicon carbide (SiC) substrate.

BACKGROUND

2. Related Background Art

It has been well known that a process of forming a high electron mobility transistor (HEMT) made of nitride semiconductor materials epitaxially grown on a substrate made of silicon carbide (SiC). The nitride semiconductor layers includes, from a side of the SiC substrate, a nucleus forming layer made of aluminum nitride (AlN), a channel layer made of gallium nitride (GaN), a barrier layer made of aluminum gallium nitride (AlGaN), and a cap layer made of GaN. Japanese Patent Applications laid open Nos. JP2013-012767A, JP2013-251330, and JP2009-194002A have disclosed such a process. However, a HEMT made of primarily nitride semiconductor materials inherently shows a drift of the drain current, where the drift is typically described as a gradual change of the drain current after an application of a gate bias. The present invention may provide one solution to suppress or to eliminate the drift in the drain current.

SUMMARY

An aspect of the present invention relates to a process of forming an epitaxial substrate. The process includes steps of: (1) measuring first reflectivity of a semiconductor substrate made of silicon carbide (SiC) by a monitoring beam with a wavelength from 350 to 720 nm; (2) growing a nucleus forming layer made of aluminum nitride (AlN) on the semiconductor substrate using a metal organic chemical vapor deposition (MOCVD) technique as measuring second reflectivity of the nucleus forming layer by the monitoring beam during a growth of the nucleus forming layer; and (3) ending the step of growing the nucleus forming layer when of the second reflectivity normalized by the first reflectivity enters within a preset range.

DESCRIPTION OF THE DRAWINGS

The foregoing and other purposes, aspects and advantages will be better understood from the following detailed description of a preferred embodiment of the invention with reference to the drawings, in which:

FIG. 4 shows a change of a growth temperature and reflectivity of a surface of the SiC substrate and semiconductor layers grown thereon for monitoring beams with wavelengths of 404.6 nm and 951.4 nm, respectively;

FIG. 5A shows a relation of the change in the reflectivity for the monitoring beam with the wavelength of 404.6 nm against an elapsed time from the beginning of the epitaxial growth, FIG. 5B shows a relation of the change in the reflectivity against the thickness of the AlN nucleus forming layer, and FIG. 5C shows a relation of the change in the reflectivity against the growth temperature for the AlN nucleus forming layer when the growth period is set to be 193 seconds;

DESCRIPTION OF EMBODIMENT

Next, some embodiments according to the present invention will be described as referring to accompanying drawings. The present invention, however, is not restricted to those embodiment and includes all changed and modification within a scope defined by claims attached hereto and equivalents thereof.

Figure 1A:
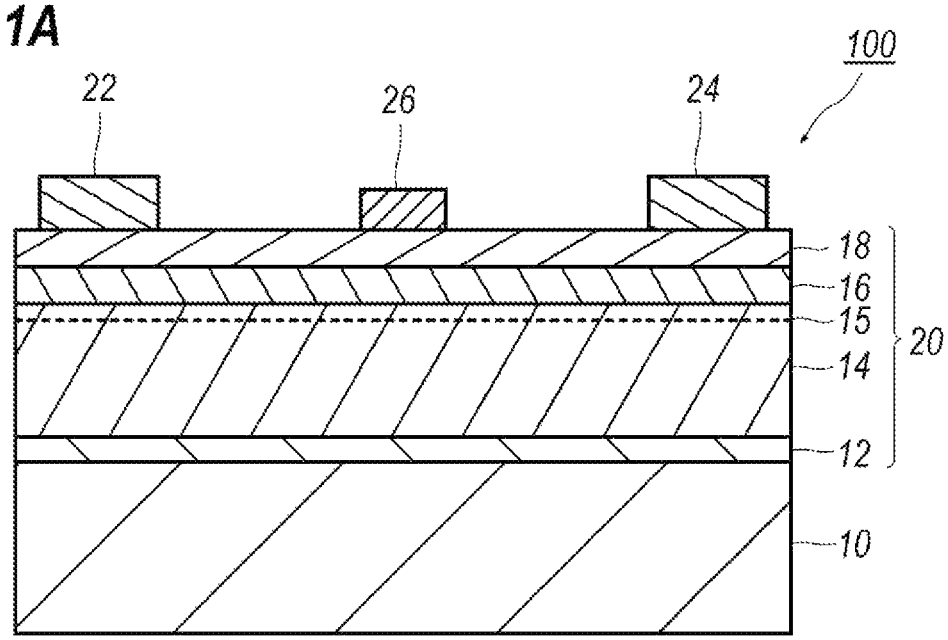
FIG. 1A shows a cross section of a high electron-mobility transistor (HEMT)
Figure 1B:
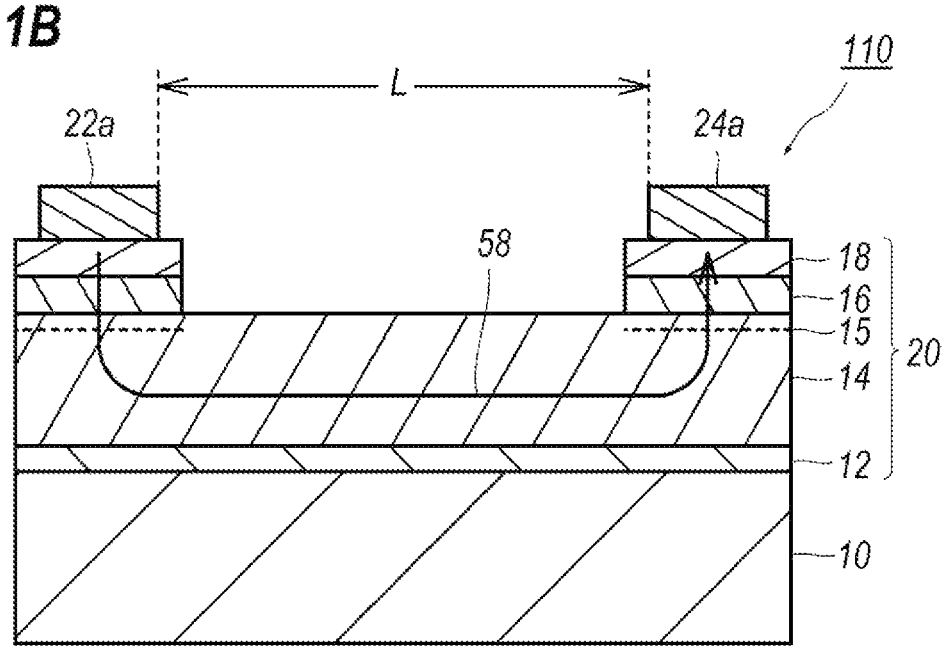
FIG. 1B shows a cross section of a specimen to evaluate a bulk current flowing in the channel layer of the HEMT.

FIG. 1A schematically shows a cross section of a high electron mobility transistor (HEMT) 100 made of primarily nitride semiconductor materials, and FIG. 1B also schematically shows a cross section of a specimen 110 used for evaluating a bulk current. The HEMT 100 provides a semiconductor epitaxial layers 20 on a substrate 10 made of silicon carbide (SiC). The semiconductor epitaxial layers 20 includes, from the side of the SiC substrate 10, a nucleus forming layer made of aluminum nitride (AlN) 12, a channel layer 14 made of gallium nitride (GaN), a barrier layer 16 made of aluminum gallium nitride (AlGaN), and a cap layer 18 made of also GaN. The GaN channel layer 14 forms a two-dimensional electron gas (2DEG) at an interface against the AlGaN barrier layer 16. The HEMT further provides a source electrode 22, a drain electrode 24, and a gate electrode 26 on the GaN cap layer 18.

The AlN nucleus forming layer 12, the GaN channel layer 14, the AlGaN barrier layer 16, and the GaN cap layer 18 may have thicknesses of 10 to 15 nm, around 600 nm, around 24 nm, and around 5 nm, respectively. The AlGaN barrier layer 16 has an aluminum composition of about 0.22. The AlN nucleus forming layer 12 and the GaN channel layer 14 may be undoped; while, the AlGaN barrier layer 16 and the GaN cap layer 18 may be doped with silicon (Si), which show an n-type conduction. The source and drain electrodes, 22 and 24, may be formed by alloying stacked metals of, from the side of the GaN cap layer 18, tantalum, aluminum, and another tantalum, Ta/Al/Ta. The gate electrode 26 has stacked metals of nickel, palladium, and gold, Ni/Pd/Au, where Ni makes a Schottky contact against the GaN cap layer 18.

The specimen 110 has only two electrodes, 22a and 24a, having structures same with those of the source electrode 22 and the drain electrode 24 of the HEMT 100, respectively. The specimen 110 removes the GaN cap layer 18 and the AlGaN barrier layer 16 between the source electrode 22 and the drain electrode 24, where the GaN channel layer 14 in an upper portion thereof is depleted and no 2DEG is formed thereat. Biasing between the electrodes, 22a and 24a, where the electrode 24a is positively biased against the other electrode 22a, an electron flows within the GaN channel layer 14 toward a direction denoted by an arrow 58 in FIG. 1B.

The HEMT 100 shown in FIG. 1A often shows a drift in the drain current flowing from the drain electrode 24 to the source electrode 22, which is sometimes called as a current collapse; that is, the drain current gradually varies with a time constant of several micro seconds after the drain electrode 24 is statically biased against the source electrode 22.

The current collapse in the drain current was evaluated in the HEMT 100 whose arrangement shown in FIG. 1A; also, the bulk current was evaluated by the specimen 110 shown in FIG. 1B. The HEMT 100 has a distance of 5 μm from the drain electrode 24 to the source electrode 22, while, a gate width of 100 μm. The specimen 110 has a distance L of 2 μm from the electrode 24a to the other electrode 22a and the electrode width of 100 μm. A width of the gate electrode 26 measured along the direction from the drain electrode 24 to the source electrode 22 illustrated in FIG. 1A corresponds to the gate length, and the gate width corresponding to a width measured perpendicular to the gate length above described.

Table below summarizes conditions of epitaxial growth of respective layers from the AlN nucleus forming layer 12 to the GaN cap layer 18 by the metal organic chemical vapor deposition (MOCVD) technique.

| layer | thickness (nm) | pressure (torr) | temperature (° C.) | source material flow rate |
|---|---|---|---|---|
| AlN buffer 12 | 12~14 | 100 | 1095~1105 | TMA: 130 sccm NH$_3$: 15 slm |
| GaN channel 14 | 600 | 100 | 1060 | TMG: 54 sccm NH$_3$: 20 slm |
| AlGaN barrier 16 | 24 | 100 | 1060 | TMA: 137 sccm TMG: 37 sccm NH$_3$: 22.5 slm SiH$_4$: 5.8 sccm |
| GaN Cap 18 | 5 | 100 | 1060 | TMG: 63 sccm NH$_3$: 22.5 slm SiH$_4$: 22.4 sccm |

In the above table, terms TMA, TMG, NH$_3$, and SiH$_4$ mean tri-methyl-aluminum, tri-methyl-gallium, ammonia, and silane, respectively. Also, sccm and slm are units of a flow rate of a standard gas, namely, standard cc per a minute and standard liter per a minute, where one (1) sccm=1.667× 10$^{-8}$ m$^3$/second and one (1) slm=1.667×100$^{-11}$ m$^3$/second. A "torr" is a unit of pressure where one (1) torr is 133.3 Pa.

The current collapse of the drain current was evaluated by a ratio of the drain current at one micro-second (μs) after the supplement of the drain bias of 50 V, which may be called as an instant current against the drain current measured enough after the supplement of the static drain bias of 50 V, which may be called as the saturation current I$_{sr}$. That is, the current collapse was measured by a ratio of ΔI=I$_{in}$/I$_{sr}$×100 [%]. The ratio ΔI of 100% or closer to 100% means that the instant current I$_{in}$ measured 1 μs after the supplement of the drain bias becomes substantially equal to the saturation current I$_{sr}$. On the other hand, when the ratio ΔI is small, the drain current shows a large current collapse.

Figure 2:
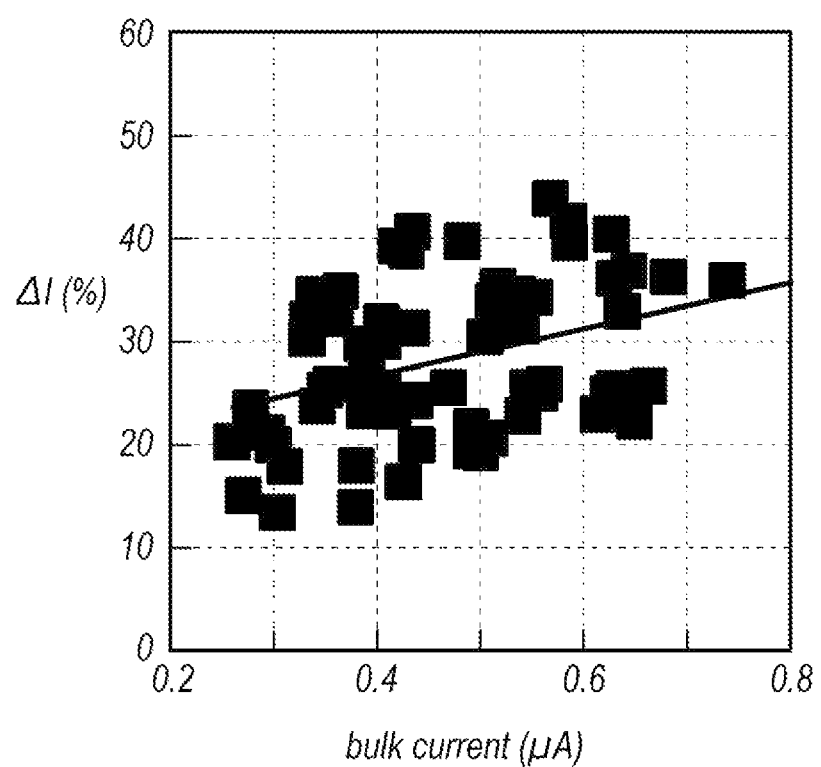
FIG. 2 shows a drift in the drain current of the HEMT, where the drift is defined by a ratio of an instantaneous current measured one (1) micro-second after a gate bias is applied to the HEMT against a saturation current measured enough after the gate bias is applied.

FIG. 2 shows a relation of the ratio ΔI against the bulk current measured for various thicknesses of the AlN nucleus forming layer 12. As shown in FIG. 2, the current collapse ΔI shows a linear relation against the bulk current. The ratio ΔI increases as the bulk current increases, which means that the current collapse in the drain current decreases as the bulk current increases.

The current collapse in the drain current of the HEMT 100 made of nitride semiconductor materials seems to depend on crystal quality of the GaN channel layer 14 in a portion closer to the AlN nucleus forming layer 12. Lesser crystal quality in the GaN channel layer may accelerate capture of carriers, namely, electrons transported within the GaN channel layer 14 by defects in the crystal, and the crystal quality of the GaN channel layer 14 strongly depends on the quality of the AlN nucleus forming layer 12. In the specimen 110, the bulk current flows in the channel layer 14 in a portion closer to the AlN nucleus forming layer 12 because a portion closer to the surface thereof is depleted. Accordingly, the bulk current may become an index to measure the crystal quality of the GaN channel layer 14, in particular, the GaN channel layer 14 in the portion closer to the AlN nucleus forming layer 12. A smaller bulk current in FIG. 2 implies that the crystal quality of the GaN channel layer in the portion closer to the AlN nucleus forming layer 12 is degraded.

Figure 3B:
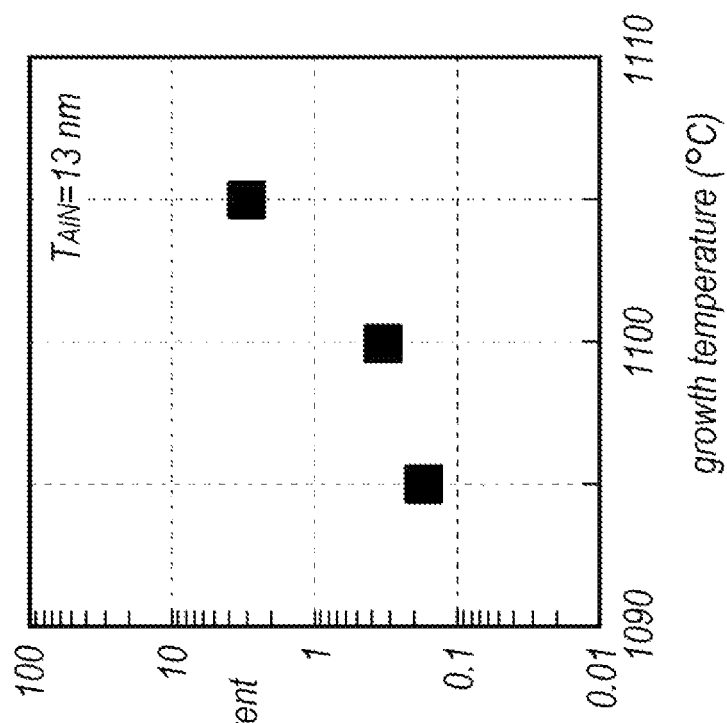
FIG. 3B shows a relation of the bulk current against a growth temperature of the AlN nucleus forming layer.
Figure 3A:
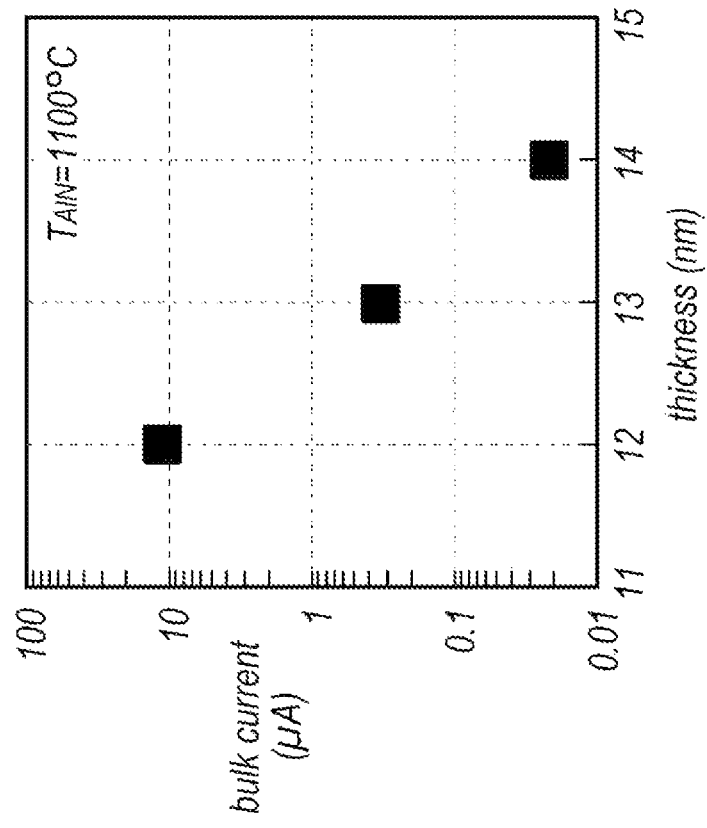
FIG. 3A shows a relation of the bulk current against a thickness of the AlN nucleus forming layer.

The bulk current was first measured for a specimen having the AlN nucleus forming layer 12 with a thickness of 12 to 14 nm and growing under a temperature of 1095 to 1105° C. FIG. 3A shows the bulk current against the thickness of the AlN nucleus forming layer 12 grown at a growth temperature T$_{AlN}$ of 1100° C., while, FIG. 3B shows the bulk current against the growth temperature for the AlN nucleus forming layer 12 having a thickness t$_{AlN}$ of 13 nm.

The bulk current became greater as the thickness t$_{AlN}$ decreased as shown in FIG. 3A, while, the bulk current became greater as the growth temperature T$_{AlN}$ increased. Thus, the AlN nucleus forming layer 12 may enhance the quality of the GaN channel layer 14 as the thickness thereof becomes thinner and the growth temperature thereof becomes higher. One reason is because a thicker AlN nucleus forming layer is grown in islands. For instance, when an AlN nucleus forming layer is grown thicker than a critical thickness, which may be, for instance, 4 nm, the AlN nucleus forming layer is generally grown in islands, which also grows the GaN channel layer in islands. Extremely thinner AlN nucleus forming layer 12 makes the normal growth of the GaN channel layer 14 impossible because the AlN nucleus forming layer 12 has a function of a buffer layer for growing the GaN channel layer 14 on the SiC substrate 10. Also, a higher growth temperature of the AlN nucleus forming layer 12 may suppress the growth of the AlN nucleus forming layer in islands and enhance the crystal quality of the GaN channel layer 14.

A mechanism for growing the GaN channel layer 14 with good crystal quality has many unknown and unsolved factors; but at least a precise control in a thickness and a growth temperature thereof is inevitable. The growth temperature of the AlN nucleus forming layer may be measured by a pyrometer using reflection of infrared light. On the other hand, the AlN nucleus forming layer 12 for making the crystal quality of GaN channel layer 14 with good quality is restricted in a thickness of 10 to 20 nm, which is too thin for measuring the thickness of grown AlN nucleus forming layer 12 by an optical apparatus such as a spectrometer. The transmission electron microscope (TEM) may determine the thinness of the grown AlN nucleus forming layer 12, but the TEM is a type of the destructing inspection.

Reflection at a surface of the AlN barrier layer 12 during the epitaxial growth on the SiC substrate 10 is able to be monitored. FIG. 4 shows the temperature of the substrate 10 and the reflectivity of the surface of the AlN nucleus forming layer grown on the substrate 10. The reflectivity is measured by two monitoring beams each having wavelengths of 951.4 nm and 404.6 nm, where the former is obtained from a semiconductor laser diode with an active layer made of gallium arsenide (GaAs) slightly containing indium (In), while, the latter is output from a semiconductor laser diode made of primarily nitride semiconductor materials, typically gallium nitride (GaN). As shown in FIG. 4, the reflection by the former laser beam (951.4 nm) shows substantially no changes during the growth of the AlN nucleus forming layer 12, but the reflection by the latter monitoring beam (404.6 nm) shows a decrease during the growth of the AlN nucleus forming layer 12.

As described, the surface of the AlN nucleus forming layer 12 accompanies with many islands, where the reflection thereat may be described by a scattering coefficient α given by:

$$\alpha = \pi d/\lambda, \quad (1)$$

where π, d and λ are a circular constant, an average diameter of particles and a wavelength of the monitoring beam, respectively. When the scattering coefficient α is enough smaller than unity (1), the scattering by particles becomes what is called as the Rayleigh scattering. Because the AlN nucleus forming layer 12 has a thickness of about 10 nm, the average diameter of the particles emulating the islands may be regarded as about 10 nm, and, according to equation (1) above, the scattering co-efficient α is given by 3.14×10/404.6~0.078 and 3.14×10/951.4~0.033, for respective monitoring beams, which are far smaller than unity (1) and the scattering model becomes the Rayleigh scattering.

The scattering cross section κs in the Rayleigh scattering is given by:

$$\kappa s = (2\pi^5/3) \times \{(n^2-1)/(n^2+2)\}^2 \times d^6/\lambda^4, \quad (2)$$

where d and n are an average diameter of particles and a refractive index, respectively. Thus, the scattering cross section κs of the Rayleigh scattering is reversely proportional to the fourth power of the wavelength λ. That is, the Rayleigh scattering cross section κs for the wavelength of 951.4 nm becomes about 1/30 of the Rayleigh scattering cross section for the wavelength of 404.6 nm. The islands appearing on the surface of the AlN nucleus forming layer 12 causes the Rayleigh scattering for the monitoring beam with the wavelength of 404.6 nm, which reduces the reflection thereat. While, the islands on the surface of the AlN nucleus forming layer 12 show substantially no Rayleigh scattering for the laser beam with the wavelength of 951.4 nm, which is the reason why the monitoring beam with the wavelength of 951.4 nm cause no changes in the reflectivity.

Introducing a parameter R that is a ratio of the reflectivity $R_1$ at the grown surface of the AlN nucleus forming layer 12 at the completion of the growth against the reflectivity $R_0$ at the beginning of the growth, namely, the reflectivity of the surface of the SiC substrate 10 and $R = R_1/R_0$; the process of growing the AlN nucleus forming layer 12 was evaluated. FIG. 5A shows a relation of the ratio R against the elapsed time for growing the AlN nucleus forming layer 12, where the growth temperature $T_{AlN}$ was set to be 1100° C. As FIG. 5A clearly shows that the ratio R decreases as the growth of the AlN nucleus forming layer 12, which means that the grown surface enhances the growth in islands.

FIG. 5B shows a relation of the ratio R against the thickness of the AlN nucleus forming layer 12. The ratio R strongly depends of the thickness of the AlN nucleus forming layer 12. FIG. 5C shows a relation of the ratio R against the growth temperature $T_{AlN}$. The ratio R increases as the growth temperature $T_{AlN}$ becomes higher. A higher growth temperature $T_{AlN}$ may compensate the undulation due to the islands in the surface of the AlN nucleus forming layer 12, which enhances the reflection thereat and the ratio R increases.

Figure 6:
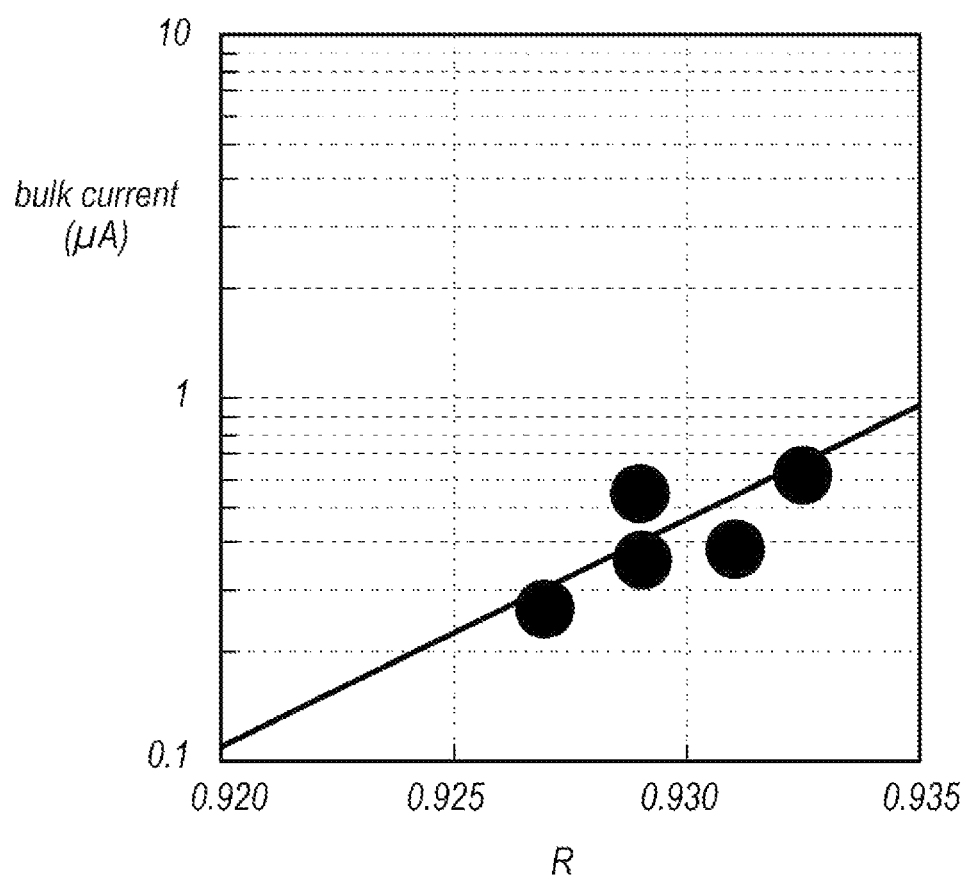
FIG. 6 shows a behavior of the bulk current against the change in the reflectivity.

FIG. 6 shows a relation of the bulk current against the ratio R. As described, the bulk current was measured for the GaN channel layer 14 of the specimen shown in FIG. 1A, where the AlN nucleus forming layer 12 under the GaN channel layer was grown under various conditions to vary the ratio R in the horizontal axis in FIG. 6. As shown in FIG. 6, the bulk current increases as increasing the ratio R. Note that the bulk current in the vertical axis in FIG. 6 is measured by the logarithmic scale. Referring back to FIG. 2, a greater bulk current may effectively compensate the current collapse in the drain current of the HEMT 100.

In other words, a thicker AlN nucleus forming layer shows a smaller ratio R in the reflectivity at the surface of the AlN nucleus forming layer 12, which decreases the bulk current and resultantly enhances the current collapse in the drain current of the HEMT 100. The reduction of the ratio R, which means that the crystal quality of the AlN nucleus forming layer 12 degrades, increases the current collapse of the drain current of the HEMT 100.

Next, an embodiment according to the present invention will be described.

Figure 7:
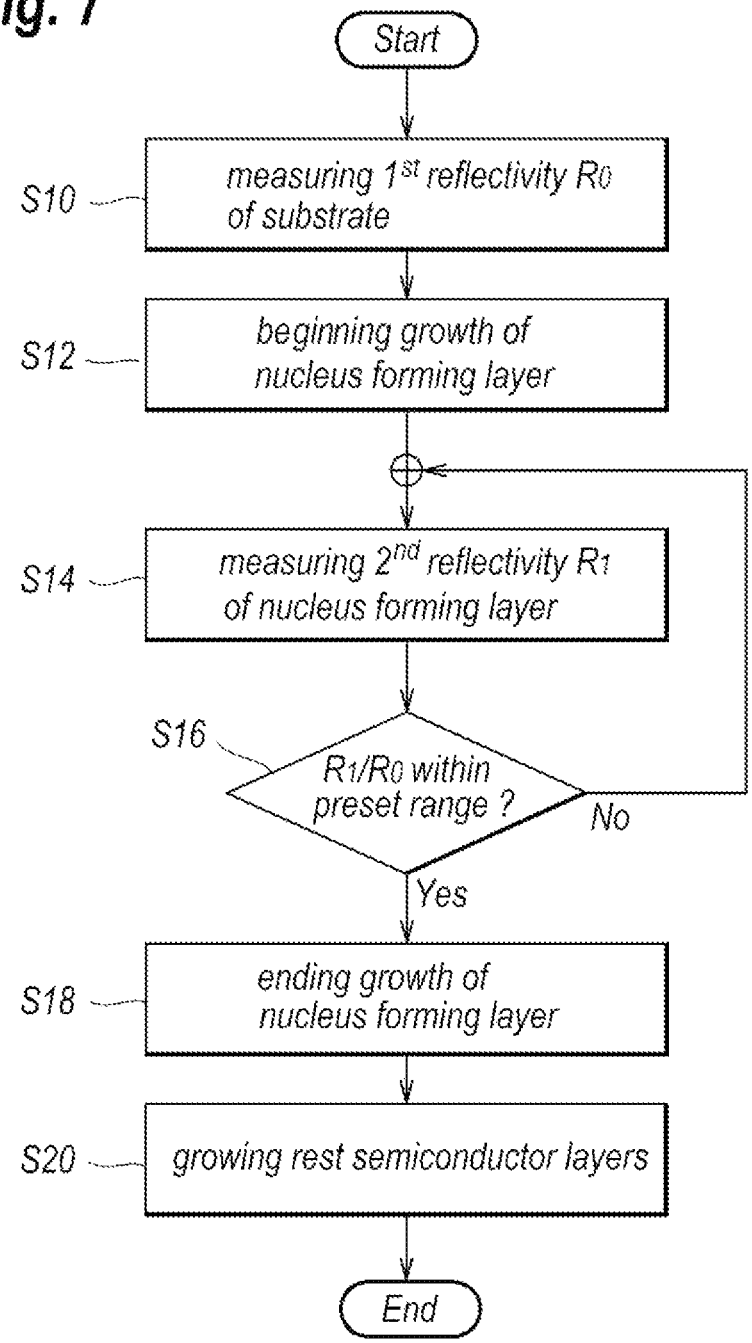
FIG. 7 shows a flow chart for producing an epitaxial substrate according to an embodiment of the present invention.
Figure 8A:
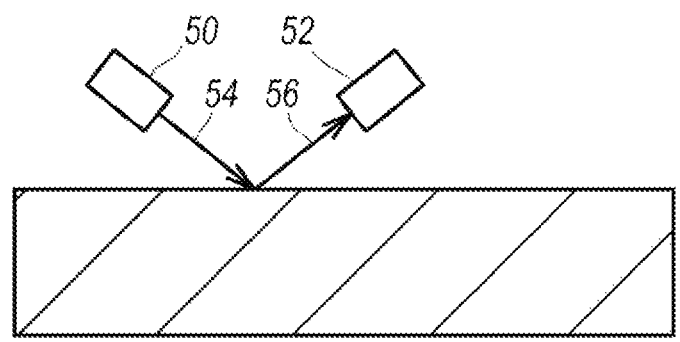
FIG. 8A to FIG. 8D show cross section of the HEMT at respective steps of the process of forming the epitaxial substrate according to the embodiment of the invention.

FIG. 7 shows a flow chart of a process of growing the AlN nucleus forming layer 12 on the SiC substrate 10 according to the present embodiment; and FIG. 8A to FIG. 8D show cross section of the HEMT 100 at respective steps of the process of forming the HEMT 100. As shown in FIG. 7 and FIG. 8A, the SiC substrate 10 is first set on a susceptor in a growth chamber of the MOCVD apparatus. Supplying hydrogen ($H_2$) as a carrier gas, the temperature of the susceptor, which is substantially equal to a temperature of the substrate 10, is raised to the growth temperature for the AlN nucleus forming layer 12. Then, the reflectivity $R_0$ of the surface of the SiC substrate 10 is measured at step S10 shown in FIG. 7. Illuminating the surface of the SiC substrate 10 with the laser beam 54 coming from the laser apparatus 50, the detector 52 may measure the laser beam 56 reflected by the surface of the SiC substrate 10 to evaluate the reflectivity $R_0$.

Figure 8B:
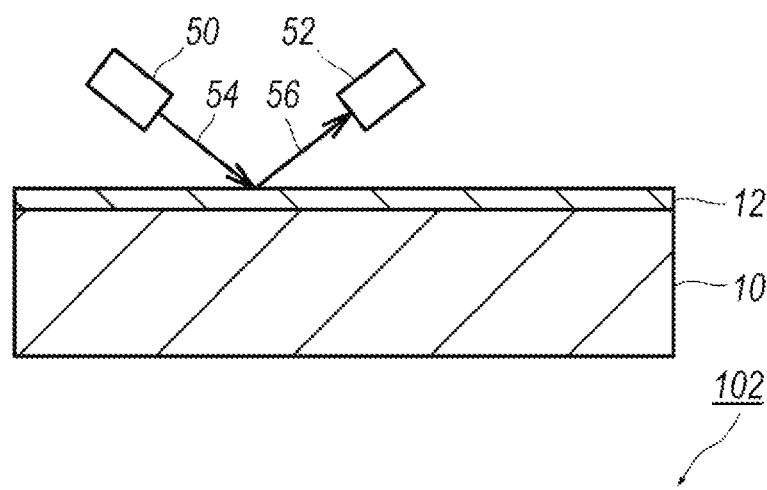

Then, as shown in FIG. 7 and FIG. 8B, the process begins to grow the AlN nucleus forming layer 12 epitaxially by supplying source gases of TMA and $NH_3$ at step S12. During the growth of the AlN nucleus forming layer 12, the grown surface is illuminated with the laser beam 54 and the detector 52 continuously detects the laser beam 56 reflected at the grown surface to evaluate the reflectivity $R_1$ at step S14. The process may calculate the ratio $R = R_1/R_0$ and decide whether the ratio R enters within a preset range at step S16. When the ratio R does not enter within the range yet, the process backs to step S14; while, when the ratio R enters within the preset range, the process stops the growth of the AlN nucleus forming layer 12 by interrupting the source gases, at step S18.

Figure 8C:
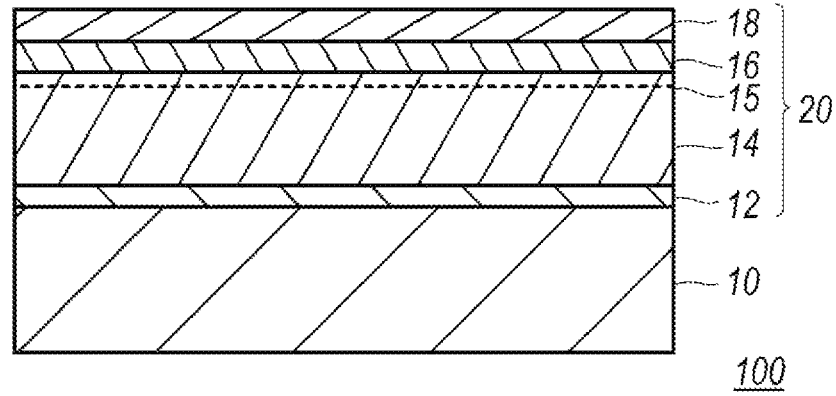
Figure 8D:
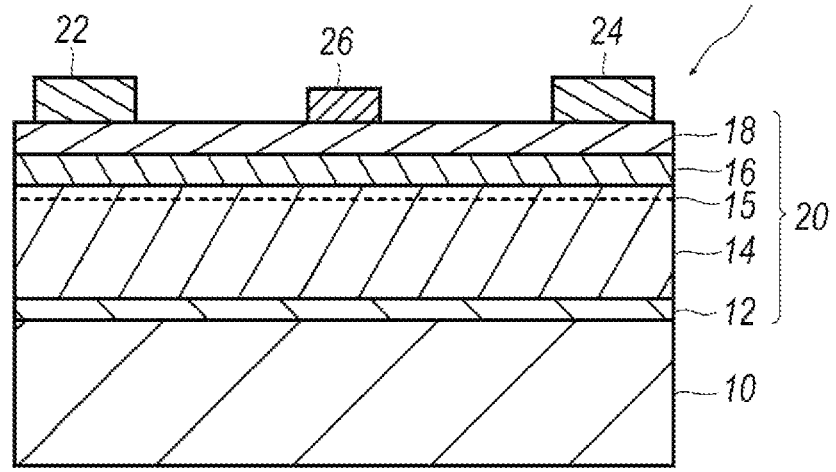

Thereafter, the process sequentially grows the GaN channel layer 14, the AlGaN barrier layer 16, and the GaN cap layer 18 on the AlN nucleus forming layer 12 by switching the source gases and varying the growth temperature. Thus, an epitaxial substrate 102 is obtained, as shown in FIG. 8C. Thereafter, forming the source electrode 22, the drain electrode 24, and the gate electrode 26 on the epitaxial substrate 102, the HEMT 100 according to the embodiment may be obtained.

As shown in equation (2) above, a monitoring beam with a wavelength shorter as possible is preferable in the process of the present embodiment because the Rayleigh scattering in the cross section thereof given by equation (2) is reversely proportional to the fourth power of the wavelength. When the cross section κs is 1/10 of that for the wavelength of 404.6 nm, a monitoring beam with a wavelength of 720 nm $(=404.6\times10^{0.25})$ or shorter is applicable. When the cross sections of 1/5, 1/3 and 1/2 for the wavelength of 404.6 nm are applicable, monitoring beams with wavelengths of 600, 530, 480 nm or shorter, respectively, becomes available.

On the other hand, the process of the embodiment is necessary to compare the reflectivity of the surface of the SiC substrate 10 and the grown surface of the AlN nucleus forming layer 12 each caused by the Rayleigh scattering. A SiC with a 6H crystal structure has bandgap energy of 2.93 eV, which corresponds to a bandgap wavelength of 423 nm. Accordingly, when a substrate 10 is made of SiC, the monitoring beam with a wavelength shorter than this bandgap wavelength is used. A monitoring beam with a wavelength longer than the bandgap wavelength, the SiC substrate may become substantially transparent to the monitoring beam and cause no Rayleigh scattering.

The process according to the present invention first measures at the step S10 the reflectivity $R_0$ of the surface of the SiC substrate 10 for the monitoring beam with the wavelength longer than 350 nm but shorter than 720 nm; then begins the epitaxial growth of the AlN nucleus forming layer 12 on the SiC substrate 10 by the MOCVD technique at the step S12. During the growth of the AlN nucleus forming layer 12, the process measures the reflectivity $R_1$ of the grown surface of the AlN nucleus forming layer 12 at the step S14. Evaluating the ratio of the latter reflectivity $R_1$ against the former reflectivity $R_0$, namely, $R=R_1/R_0$, at the step S16, the process ends the supplement of the source gases for the AlN nucleus forming layer 12 when the evaluated ratio R enters within a preset range. Thereafter, the process may grow rest nitride semiconductor layers from the GaN channel layer 14 to the GaN cap layer 18 under respective growth conditions and source gases summarized in the table above described at the step S20. Thus, the process may grow the AlN nucleus forming layer 12 to suppress the drift in the drain current.

The present embodiment may set the preset range of 0.92 to 0.935 in the ratio of the reflectivity $R_1/R_0$ for the monitoring beam with the wavelength of 404.6 nm available from a semiconductor laser diode with the active layer made of GaN, and the bulk current in the GaN channel layer 14 grown on the AlN nucleus forming layer 12 grown by the process of the embodiment becomes 0.1 to 1.0 µA, which means that the AlN nucleus forming layer 12 may have an adequate thickness for the GaN channel layer 14 having crystal quality to suppress the current collapse in the drain current of the HEMT.

The ratio $R_1/R_0$ of the reflectivity depends on the wavelength of the monitoring beam used in the measurement. A range of the wavelength of the monitoring beam to cause a change of 0.01 in the ratio $R_1/R_0$ of the reflectivity is estimated. Growing the AlN nucleus forming layer 12, the ratio $R_1/R_0$ decreases by an increase of the contribution of the Rayleigh scattering. That is, when the ratio $R_1/R_0$ is around 0.93, the contribution of the Rayleigh scattering becomes 1−0.93=0.07. When the ratio $R_1/R_0$ varies by 0.01, the contribution of the Rayleigh scattering also varies by 0.01 but the total contribution of the Rayleigh scattering is 0.07. That is, the Rayleigh scattering varies by 0.01/0.07~14.3%. The Rayleigh scattering in the cross section thereof is inversely proportional to the four power of the wavelength. Accordingly, the wavelength range for the monitoring beam within which the Rayleigh scattering in the cross section thereof varies by 14.3% becomes 390 to 420 nm for the center wavelength of 404.6 nm.

On the other hand, the wavelength range around 404.6 nm of the monitoring beam, within which the ratio $R_1/R_0$ in the reflectivity varies by 0.003, is estimated. When the ratio $R_1/R_0$ is about 0.93, the Rayleigh scattering in the magnitude thereof varies by 0.003/0.07~4.3%. Accordingly, the wavelength range around 404.6 nm is limited to 400 to 410 nm for detecting the change in the ratio of the reflectivity of 4.3%.

Based on the result shown in FIG. 6, setting the ratio $R_1/R_0$ to be 0.92 to 0.935, a preferably bulk current may be obtained, which is 0.1 to 1.0 µA. Using the monitoring beam with the wavelength of 390 to 420 nm, the variation of 0.01 in the ratio $R_1/R_0$ may be detected, which means that the process may optionally and securely end the growth of the AlN nucleus forming layer 12 because the resolution of 0.01 is substantial for the range of 0.92 to 0.935. Also, the wavelength range of 400 to 410 nm may result in the resolution of 0.003, which is also enough for the range of 0.92 to 0.935. The wavelength range of 402 to 407 nm may bring further substantial resolution in the range of 0.92 to 0.935.

The range of the ratio $R_1/R_0$ in a lower limit thereof becomes enough from a viewpoint only of the bulk current. However, when the AlN nucleus forming layer 12 is too thin, which corresponds to a condition where the reflectivity of the AlN nucleus forming layer 12 substantially causes no change from that for the surface of the SiC substrate 10, extraordinary growth of the GaN channel layer 14 appears because the AlN nucleus forming layer 12 does not show a function of a buffer layer no longer. Accordingly, an upper limit of the ratio is necessary to grown the GaN channel layer 14 with good crystal quality.

The reflectivity $R_0$ of the surface of the SiC substrate 10 is preferably carried out within the growth chamber of the MOCVD under a temperature of the SiC substrate 10 to be that for growing the AlN nucleus forming layer 12. Also, the measurement is preferably carried out as supplying the carrier gas.

The AlN nucleus forming layer 12 is preferably grown at a temperature of 1095 to 1105° C. and by a thickness of 12 to 14 nm. The barrier layer 16 is preferably made of AlGaN or InAlN. The GaN cap layer 18 may be omitted. The nitride semiconductor material may include, except for GaN and AlGaN, indium gallium nitride (InGaN), indium nitride (InN), aluminum indium gallium nitride (InAlGaN), and so on.

Although this invention has been described in certain specific exemplary embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents.

What is claimed is:

1. A process of forming an epitaxial substrate, said process comprising:
   measuring first reflectivity being the reflectivity of a semiconductor substrate made of silicon carbide (SiC) by use of a monitoring beam with a wavelength from 350 to 720 nm;
   growing a nucleus forming layer made of aluminum nitride (AlN) on the semiconductor substrate by use of a metal organic chemical vapor deposition (MOCVD) technique while measuring a second reflectivity being the reflectivity of the nucleus forming layer for the monitoring beam during the growth of the nucleus forming layer; and
   ending the growing of the nucleus forming layer when the second reflectivity normalized by the first reflectivity enters a preset range from 0.92 to 0.935.

2. The process according to claim 1,
   wherein the wavelength of the monitoring beam is 390 to 420 nm.

3. The process according to claim 2,
   wherein the monitoring beam is from a semiconductor laser diode with an active layer made of gallium nitride (GaN).

4. The process according to claim 1,
   wherein the step of measuring the first reflectivity is carried out at a temperature equal to a temperature for growing the nucleus forming layer.

5. The process according to claim 4,
   wherein the nucleus forming layer is grown under a temperature of 1095 to 1105° C.

6. The process according to claim 1,
   wherein the nucleus forming layer is grown to a thickness of 12 to 14 nm.

7. The process according to claim 1,
   further including steps of:
   growing a channel layer made of gallium nitride (GaN) on the nucleus forming layer; and
   growing a barrier layer on the channel layer.

8. The process according to claim 7,
   wherein the barrier layer is made of one of aluminum gallium nitride (AlGaN) and indium aluminum nitride (InAlN).

9. The process according to claim 7,
   further including a step of growling a cap layer made of gallium nitride (GaN) on the barrier layer,
   wherein the barrier layer and the cap layer are doped with n-type dopants.

* * * * *